MICROCONTACT SCHOTTKY BARRIER SEMICONDUCTOR DEVICE

Filed Dec. 6, 1965

INVENTOR
George G. Sumner
BY William E. Johnson, Jr.
ATTORNEY

INVENTOR
George G. Sumner

BY William E. Johnson, Jr.
ATTORNEY

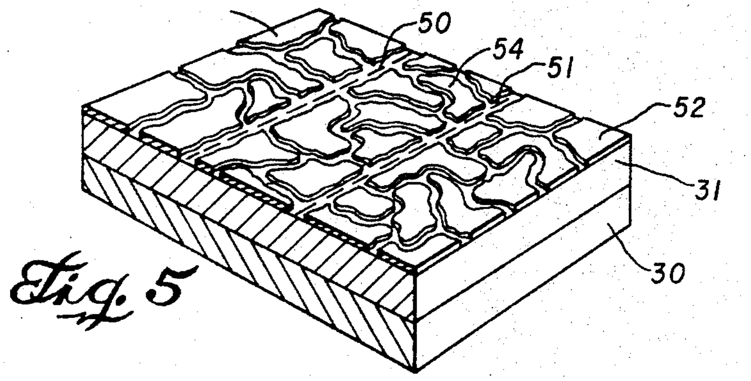
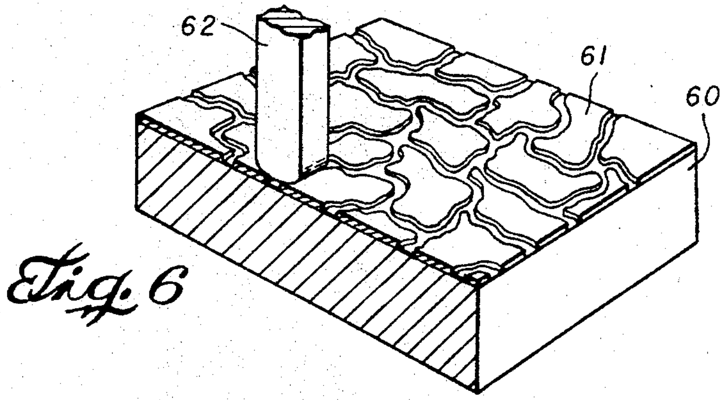
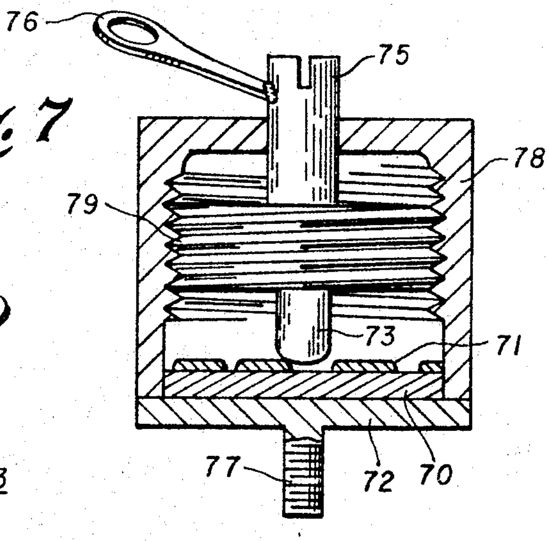
Fig. 7
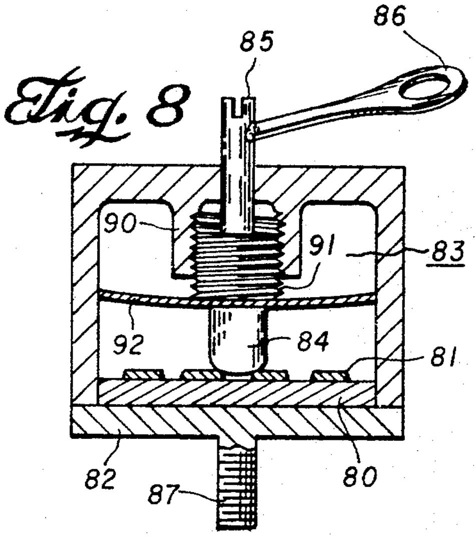
INVENTOR
George G. Sumner
BY William E. Johnson, Jr.
ATTORNEY 3,448,349

MICROCONTACT SCHOTTKY BARRIER SEMICONDUCTOR DEVICE

George G. Sumner, Richardson, Tex., assignor to Texas Instruments Incorporated, Dallas, Tex., a corporation of Delaware Filed Dec. 6, 1965, Ser. No. 511,817
Int. Cl. H01l *19/00*
U.S. Cl. 317—234 8 Claims

ABSTRACT OF THE DISCLOSURE

Disclosed are semiconductor devices and methods for making the same. In the process, deposition of a thin metal layer on a semiconductor substrate is initiated and continued only long enough to produce a discontinuous thin film of metal regions isolated from each other but not so long as to yield an electrically continuous film of the metal. Contact may be made to at least one of the isolated metal regions and to the substrate to produce a device.

The present invention relates to semiconductor devices and to methods for making contacts to semiconductor devices. More particularly it relates to methods for fabricating a semiconductor device having extremely small, isolated metal contact regions on semiconductor material.

It has been generally recognized that the inherent capacitance of a semiconductor diode is a function of the size of the junction area. Thus the capacitance is sometimes measured in terms of some number of capacitance units per square centimeter. For example, in typical conventional Au-GaAs Schottky barrier diodes, the capacitance is approximately $10^5$ pf./cm.$^2$ under zero bias conditions. A diode having a 10 mil by 10 mil junction area would thus have a capacitance of approximately 50–100 pf. As is also well-known, the frequency response of a semiconductor device is an inverse function of the junction capacitance, and to obtain high frequency (high speed) devices, a small area junction is normally required.

Conventional semiconductor diode junctions have been plagued by what has been termed a "soft knee" in the reverse biased breakdown voltage characteristics. This characteristic is observed as a rounded voltage vs. current curve on an oscilliscope presentation, as contrasted with an ideal "square" curve in which the junction would exhibit no leakage current until the breakdown voltage is applied across the junction. All semiconductor diodes, including Schottky barrier devices, are observed to have a breakdown voltage characteristic whenever sufficient reverse voltage is applied, in the sense that as the voltage is raised the current increases much more rapidly than in the normal, almost non-conducting, reverse region. Relatively speaking, it is possible to make a junction in which the curve which represents the breakdown characteristic is sharp; the diode then has a very low incremental resistance in the breakdown region, and the voltage drop varies very little over a wide range of currents. This action is known as the Zener effect. However, such a junction in the conventional diode does exhibit to some extent a certain amount of current leakage which accounts for the "soft knee." While the factors responsible for this soft behavior are not completely understood, they are seemingly associated both with surface effects and defects in the body of the junction. Thus, large area junctions increase the probability of having a surface induced leakage path and a large area junction entails a large body of semiconductor material in the junction area which increases the probability of having a defect in the body.

Although the problems associated with device capacitance and breakdown voltage are primarily a function of diodes, whether they be P–N junctions or Schottky barriers, similar problems are found in other devices, for example, transistors and silicon controlled rectifiers. As a specific example, but not by way of limitation, a point contact transistor is normally (conventionally) fabricated by placing a pointed wire (whisker) in contact with the semiconductor material. Such devices have been plagued with mechanical instability and poor electrical contact between the whisker and the semiconductor material.

It is therefore an object of the invention to provide a semiconductor diode having a decreased junction capacitance and a method for making same.

It is another object of the invention to provide a Schottky barrier device having a decreased capacitance and a method for making same.

It is a further object of the invention to provide a semiconductor diode having an improved reverse-bias breakdown characteristic and a method for making same.

It is still a further object of the invention to provide a Schottky barrier device having an improved reverse-bias breakdown characteristic and a method for making same.

It is yet another object of the invention to provide a method for fabricating an improved point contact transistor and a method for making same.

These and other objects, features and advantages of the invention will become readily apparent from the following detailed description of the preferred embodiments of the invention when taken in conjunction with the appended drawings, in which:

FIGURE 5 illustrates the wafer of FIGURE 3 having three thin metal films thereon;

FIGURE 6 illustrates a segmented view of a lead contacting one or more of the metal regions on the semiconductor wafer of FIGURE 2;

FIGURE 7 illustrates a sectional view of a means for making electrical contact to one or more of the metal regions on the wafer of FIGURE 2;

FIGURE 8 illustrates a sectional view of a second means for making electrical contact to one or more of the metal regions on the wafer of FIGURE 2;

FIGURE 9 (*b*) illustrates a typical reverse-bias breakdown voltage characteristics of a conventional Schottky barrier device.

The invention, in brief, comprises the deposition of a very thin film of metal into a semiconductor body wherein the film is so thin as to constitute a great number of individual, isolated regions of metal, the regions (or particles) of metal being typically in the range of .1 to 1.0 micron in width. The metal regions are then probed to find one or a plurality of regions having the desired electrical characteristics, the probe instrument preferably being used to make a permanent electrical contact to the desired region or regions. Thus there is fabricated a device having an extremely small junction area as well as the electrical characteristics sought after during the probing operation, such as, for example, a sharp breakdown voltage characteristic. Likewise, these small area regions are useful as emitters in other semiconductor devices, for example, point contact transistors.

Figure 1:
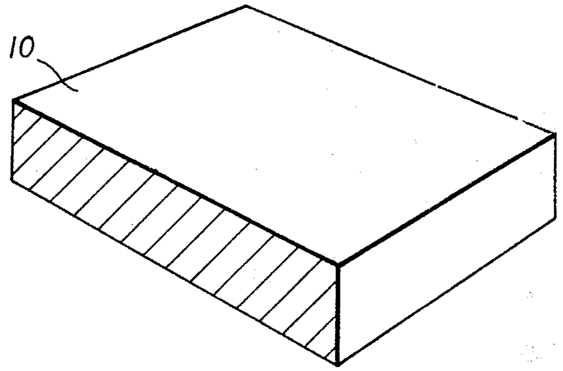
FIGURE 1 illustrates a pictorial view in partial section of a wafer of semiconductor material.
Figure 2:
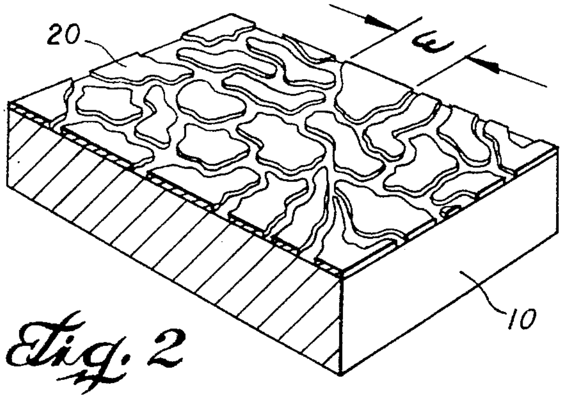
FIGURE 2 illustrates the wafer of FIGURE 1 having a thin film of isolated metal regions thereon.

For a more detailed description, particularly with respect to FIGURE 1, there is illustrated a semiconductor wafer 10, for example, of N-type gallium arsenide. FIGURE 2 illustrates a deposited thin film of metal upon the wafer 10 which is so thin that the discontinuous film, as seen on a microphotograph (not illustrated), comprises a large number of isolated regions 20, each of which has a width w of approximately .1 to 1.0 micron.

Although the materials, temperatures, surface conditions and other factors influence the deposition of the discontinuous film of metal upon the semiconductor substrate, a specific embodiment is as follows, the apparatus not being illustrated:

A gold charge is placed in a standard tungsten tube in a vacuum-type deposition chamber. The tellurium-doped gallium arsenide substrate wafer is then thermally sublimed in a vacuum of approximately $10^{-6}$ Torr while heating the wafer at approximately 400° C. for 30 minutes, the vacuum-thermal sublimation process being disclosed in my co-pending application filed Oct. 21, 1965, assigned to the assignee of the present invention, entitled "Semiconductor Surface Preparation and Device Fabrication." The thermal sublimation is followed by the evaporation of the gold (heated to approximately 1200° C.) onto the gallium arsenide wafer for approximately 15 minutes at a temperature of 300° C. It should be appreciated that a low substrate temperature is necessary in fabricating a Schottky barrier to prevent the gold from alloying into the semiconductor substrate. A conventional shutter then interrupts the evaporation process and a discontinuous film of metal is observed on the surface wherein the average width of the regions is .1 to 1.0 micron and the regions are approximately 400–500 A. thick. Examples of devices which have been fabricated according to the invention include the deposition of a thin film of gold upon gallium arsenide doped with tellurium having an impurity concentration of $1.5\times10^{17}$ atoms/cc. on one group of devices and on others there was deposited a thin discontinuous film of gold upon gallium arsenide doped with tin having an impurity concentration of $5.7\times10^{17}$ atoms/cc. The tellurium doped gallium arsenide Schottky barrier devices so constructed and subsequently probed (described hereinafter) exhibited sharp breakdown voltages in the range of 14 to 16 volts, whereas a control group of conventional Schottky barrier devices exhibited "soft knees" and a breakdown of approximately 5 volts at 10 microamps. The tin-doped gallium arsenide devices exhibited sharp breakdown voltages at approximately 9 volts as opposed to conventional devices having soft knees and a breakdown of approximately 1.5 to 2.0 volts. While the improvement in the breakdown voltage is not completely understood, the primary factor may be the increased probability of making contact to uniform semiconductor material by virtue of the very small sample of semiconductor material in contact with any given metal region. This is in effect a method of probing the semiconductor surface with a vast number of metal contacts in place until a suitable sample of semiconductor material is located. However, the effect might also be associated with a preferential growth of the metal regions on certain sites on the semiconductor face due to the difference in electrical characteristics of the different sites. Whatever be the correct theory as to why the electrical characteristics of the devices are improved is not important to a proper functioning of the devices fabricated according to the invention.

Figures 3, 4:
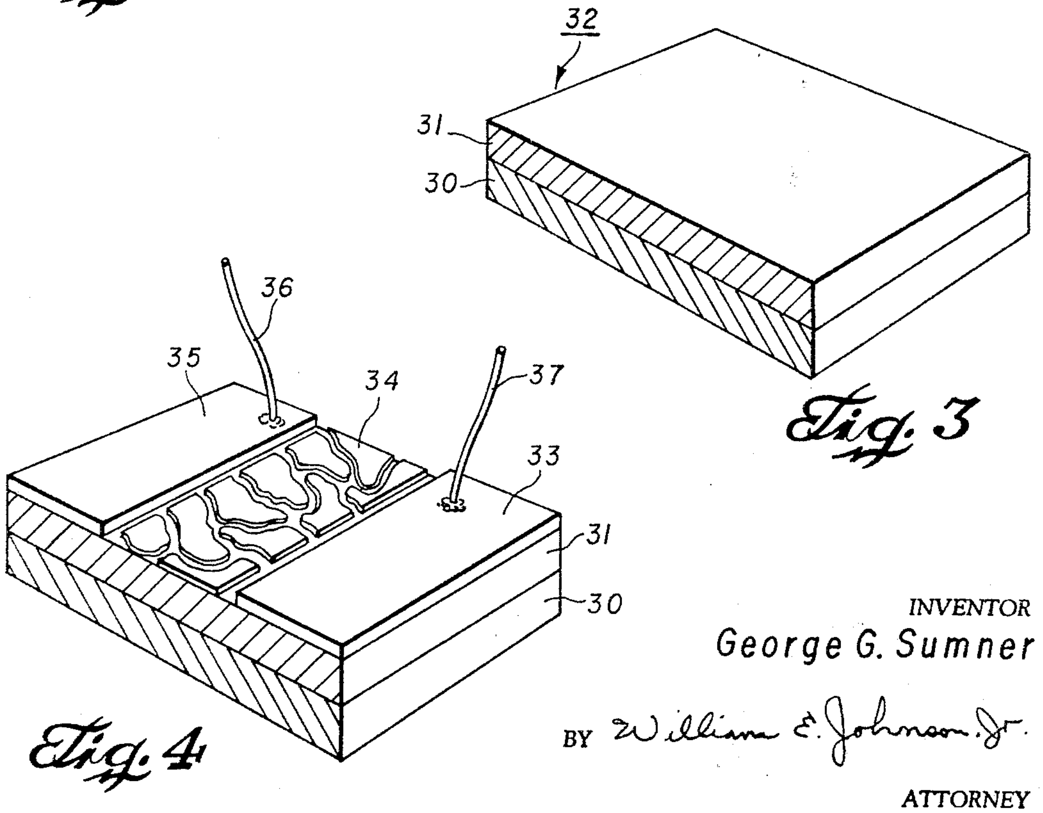
FIGURE 3 illustrates a pictorial view in partial section of a semiconductor wafer having a first region of one conductivity and a second region of a second conductivity.
FIGURE 4 illustrates the wafer of FIGURE 3 having a thin film of isolated metal regions on said wafer.

FIGURES 3 and 4 illustrate another embodiment of the invention wherein a wafer 32 of semiconductor material, for example, P-type germanium, has a diffused region 31 of N-type conductivity, the diffusion step being well-known in the art, for example, as by the diffusion of arsenic into the germanium to result in the N-type region. The extent of the diffusion and the depth of penetration is determined by the concentration of the gaseous phase, the temperture and the time. The mechanics of diffusion have been explored extensively and this technique has become a recognized procedure in the art. The top surface of region 31 is selectively masked and ohmic metal regions 33 and 35 are applied to the region 31, (as illustrated in FIGURE 4), said metal regions 33 and 35 being a gold alloy consisting of approximately 99.3% gold and .7% antimony. The regions 33 and 35 are then masked and a very thin film 34 of a gallium gold alloy (approximately 98% gold and 2% gallium) is applied to region 31, the film 34 being so thin as to be comprised of a large number of isolated metal regions. In a conventional manner, the collector region 30 is mounted on a transistor header (not illustrated) and the wires 36 and 37, having been respectively bonded to the regions 35 and 33, are attached to the base electrode of the transistor or to individual posts (electrodes) for field effect devices. As with the diode of FIGURE 2, the thin film 34 is probed for optimum electrical characteristics and the probe, to be discussed hereinafter, preferably makes a permanent contact to one or more of the isolated metal regions in the film 34, and serves as the emitter electrode of the transistor since gallium is a P-type (acceptor) element with respect to N-type germanium. Alternatively, with field effect transistor applications, the film 34 serves as the gate electrode, but is probed for optimum electrical characteristics as is the film 34 when used as an emitter electrode.

FIGURE 5 illustrates another embodiment of the invention wherein the wafer 32 of FIGURE 3, likewise having a P-type germanium region 30 and an N-type region 31, has selectively deposited thereon a first thin film 54 of metal, for example, a gold alloy consisting of 98% gold and 2% gallium, thus forming a rectifying (injective) contact to the N-type region 31. The first thin film 54 is then masked and two thin base films 52 and 53 are deposited on region 31, for example, a gold alloy consisting of 99.3% gold and .7% antimony, thus forming ohmic contacts to the base region 31. The regions 52, 53, and 54 are respectively so thin as to be comprised of a large number of isolated regions, all of which can be probed to obtain the optimum electrical characteristics, and in each of the regions 52, 53, and 54 the probe is preferably used to make a permanent electrical connection to the one or more metal regions yielding the desired results. The respective regions 52, 53 and 54 are illustrated schematically as being separated by dotted lines 50 and 51. Likewise, as was the case with the device of FIGURE 4, the region 30 to FIGURE 5 is mounted on a transistor header (not illustrated) and probe wires can be attached to the respective base and emitter electrodes of the transistor, or alternatively in a field effect device, the probe wire can be attached to the gate electrode of the field effect device (also not illustrated) and other probe wires can be attached to the source and drain electrodes.

FIGURE 6 illustrates a wafer 60 of semiconductor material having thereon a discontinuous thin film of isolated metal regions 61, and a segmented portion of a probe unit 62. It should be appreciated by those skilled in the art that even though one or more of the regions 61 have been probed and determined to be electrically attractive, the problem remains as to how a permanent contact can be made to such a small region as the metal particles 61, the regions having a mean width of approximately .1 to 1 micron. Therefore, the probe 62 is preferably a sharpened instrument, being approximately .1 to .3 mil in diameter at the point to enable the probe to contact only a very few of the metal regions 61. However, even after the probe makes contact with one or more of the metal regions, there must be pressure means available for maintaining the electrical contact between the probe 62 and the metal regions 61. Examples of such means, not to be construed as limitations upon the invention, are shown in FIGURES 7 and 8.

FIGURE 7 illustrates a sectional view of an encapsulated diode fabricated according to the invention having a semiconductor wafer 70 for example, GaAs, and a very thin metal film, for example gold, said film consisting of a great number of isolated metal regions 71. The metal filmed semiconductor wafer is mounted on the metal header 72, said header having a conventional stud-mounting assembly 77 attached thereto. The walls 78 are non-electrically conductive, for example, nylon or teflon and are threaded to receive the threaded metal portion 79 of the variable position probe assembly 73. One end 75 of the probe assembly is arranged for turning by the use of a slot to thus cause the probe 74 to be threadedly moved into contact with one or more of the regions 71. The metal member 76 is used as the counter electrode to stud member 77. While it is not illustrated, it should be appreciated that either the probe assembly 73 or the semiconductor wafer can be mechanicaly indexed by one skilled in the art so that the probing operation can scan the metal film regions 71 until one or more of the regions yield the desired electrical qualities.

FIGURE 8 illustrates another embodiment of mechanical means for engaging a probe member 84 with the metallized regions 81 deposited on semiconductor wafer 80. The variable position probe apparatus 83 comprises a diaphragm or spring member 92, a slotted member 85 for advancing or retarding the threaded metallic member 91, a non-conduction threaded housing 90 mated to receive the threaded member 91, and a metal member 86 for use as a counter electrode to stud member 87, the housing of the semiconductor wafer 80 being mounted on the header member 82 by conventional methods, such as, for example, by soldering. As with FIGURE 7, it should be appreciated that an additional mechanism can be added to the housing to enable the indexing of either or both of the semiconductor wafer and the probe assembly by one skilled in the art to permit a scanning of the metal regions 81 until one or more of the regions yield the desired electrical qualities, although such an indexing mechanism is not illustrated.

FIGURES 7 and 8 have illustrated examples of means for electrically contacting the deposited metal regions on the semiconnductor wafer. However, in no sense are these examples to be construed as a limitation upon the present invention. The contact can also, to name a few more examples, be made by a conventional whisker, or by the constantly improving photomask techniques, specifically those embodied in the copending application Ser. No. 397,413, filed Sept. 18, 1964, and assigned to the assignee of the present invention, wherein a cross-stripe geometry is used to fabricate a hole in an oxide layer some 1 or 2 microns wide on a side. The hole is filled with a metal contact material, such as evaporated gold, and expanded out over the oxide layer in what is now termed in the art as an expanded contact, to which a wire terminal can be bonded. Any suitable means for contacting the isolated metal regions of the invention can be used, including those techniques employing an electron beam.

Figure 9A:
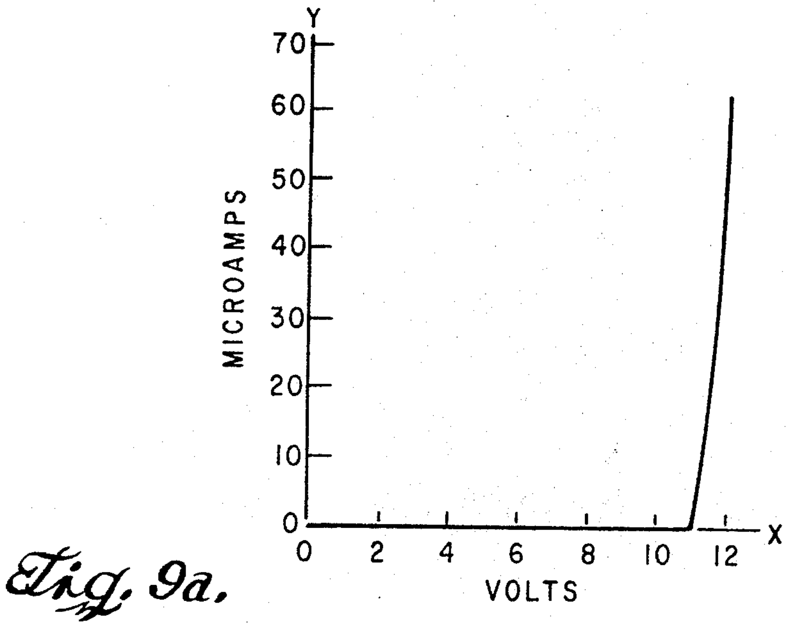
FIGURE 9 (*a*) illustrates a typical reverse-bias breakdown voltage characteristic of a Schottky barrier device fabricated according to the invention.
Figure 9B:
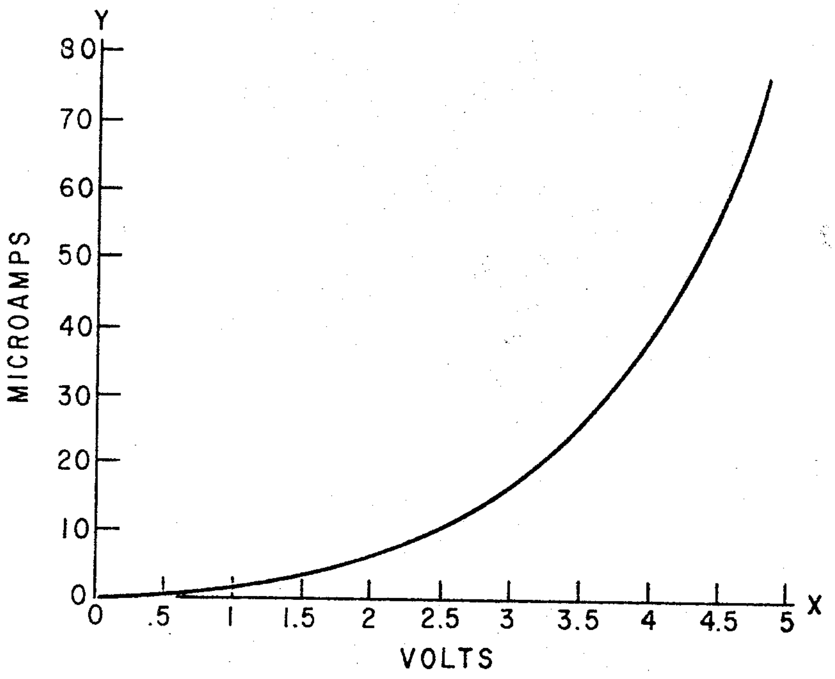

FIGURE 9 (*a*) illustrates a typical curve of a Schottky barrier device fabricated according to the invention, wherein the device has a sharp or square-cornered breakdown characteristic, whereas a conventional Schottky barrier device generally has the breakdown characteristics of FIGURE 9 (*b*), including the reduced voltage and soft knee appearance.

While the invention has been described and illustrated with specific reference to given semiconductor materials, specific deposited metal films and specific means for contacting those films, the descriptions and illustrations are merely the preferred embodiments described in detail, and it is to be understood that various changes, substitutions and alterations can be made therein without departing from the spirit and scope of the invention as defined by the appended claims. For example, the wafer 10, of FIGURE 2 having the metal regions 20 thereon, can be used as a point contact transistor by having two probe members contact the region 20, the contacted regions being approximately one mil apart for the desired transistor behavior.

What is claimed is:

1. A semiconductor device comprising:
(a) a semiconductor wafer;
(b) a discontinuous thin film of isolated islands of metal regions each approximately 0.1 to 1.0 micron wide deposited on said wafer; and
(c) ohmic contact means to at least one of said metal regions.

2. The semiconductor device according to claim 1 wherein said ohmic contact means comprises a contact probe.

3. The semiconductor device according to claim 1 wherein said metal regions comprise gold and said semiconductor wafer comprises gallium arsenide.

4. A transistor comprising:
(a) a semiconductor wafer of a first conductivity type having a semiconductor region of a second conductivity type diffused into said wafer;
(b) a discontinuous thin metal film of isolated islands of metal regions each approximately 0.1 to 1.0 micron wide of said first conductivity type deposited upon said diffused region, whereby said wafer is the collector, the diffused region is the base, and the metal regions are the emitter of said transistor;
(c) first ohmic contact means to said base region; and
(d) second ohmic contact means to at least one of said metal emitter regions.

5. The transistor according to claim 4 wherein said first ohmic contact means comprises a discontinuous thin film of metal regions of said second conductivity type and means for contacting at least one of said metal regions.

6. The transistor according to claim 4 wherein said second ohmic contact means comprises a contact probe.

7. The transistor according to claim 5 wherein said means for contacting at least one of said metal regions comprises a contact probe.

8. The semiconductor device according to claim 1 wherein said metal regions form Schottky barriers.

References Cited

UNITED STATES PATENTS 3,360,851 2/1968 Kahng et al. -------- 317—234

JOHN W. HUCKERT, *Primary Examiner.*

M. EDLOW, *Assistant Examiner.*

U.S. Cl. X.R.

117—212; 317—235